United States Patent [19]

Lingampalli

[11] Patent Number: 5,785,878
[45] Date of Patent: Jul. 28, 1998

[54] RF ANTENNA HAVING HIGH TEMPERATURE, OXIDATION RESISTANT COATING

[75] Inventor: Ramkishan Rao Lingampalli, Fremont, Calif.

[73] Assignee: Applied Materials, Inc., Santa Clara, Calif.

[21] Appl. No.: 552,224

[22] Filed: Nov. 2, 1995

[51] Int. Cl.$^6$ .................................................. H05H 1/00
[52] U.S. Cl. .................. 216/68; 156/345; 118/723 I; 438/729; 204/192.12; 204/298.08; 204/298.34
[58] Field of Search .................. 118/723 I, 723 IR, 118/723 AN; 156/345; 204/192.12, 298.34, 298.08; 216/68; 427/569; 438/729

[56] References Cited

U.S. PATENT DOCUMENTS

| | | | |
|---|---|---|---|
| 5,231,334 | 7/1993 | Paranjpe | 315/111.21 |
| 5,277,751 | 1/1994 | Ogle | 156/345 X |
| 5,346,578 | 9/1994 | Benzing et al. | 118/723 I X |
| 5,531,834 | 7/1996 | Ishizuka et al. | 118/723 I |
| 5,560,776 | 10/1996 | Sugai et al. | 118/723 I X |
| 5,587,226 | 12/1996 | Leung et al. | 428/210 |

FOREIGN PATENT DOCUMENTS 2231197  11/1990  United Kingdom.

OTHER PUBLICATIONS

Annual Book of ASTM Designation B733—90$^{1\epsilon}$, pp. 479–484, 1990.

Hawley's Chemical Dictionary, 12th ed./revised by Richard J. Lewis, Sr., p. 930, 1993.

Perry's Chemical Engineers' Handbook, 6th ed., pp. 23–41 and 23–58 to 23–62, 1984.

*Primary Examiner*—Thi Dang

[57] ABSTRACT

A high temperature, oxidation resistant coating is provided for an RF antenna used in semiconductor processing. In a preferred embodiment, the coating is made of nickel to protect the antenna against oxidation at high temperatures.

17 Claims, 2 Drawing Sheets

RF ANTENNA HAVING HIGH TEMPERATURE, OXIDATION RESISTANT COATING

FIELD OF THE INVENTION

The present invention relates to semiconductor processing equipment, and more particularly to semiconductor processing equipment which utilize RF energy.

BACKGROUND OF THE INVENTION

Low pressure radio frequency (RF) generated plasmas have become convenient sources of energetic ions and activated atoms which can be employed in a variety of semiconductor device fabrication processes including surface treatments, depositions, and etching processes. For example, to deposit materials onto a semiconductor wafer using a sputter deposition process, a plasma is produced in a chamber which includes a negatively biased sputter target material. Ions created within the plasma impact the surface of the target to dislodge, i.e., "sputter" material from the target. The sputtered materials are then transported and deposited on the surface of the semiconductor wafer.

The RF energy is typically inductively coupled into the chamber from an antenna electrically coupled to an RF generator. In one design, the antenna is formed from a coil of copper wire or tubing which surrounds the upper portion of the exterior of the chamber. The copper coil is typically coated with a layer of polyamide to protect the antenna copper from oxidation.

An enclosure shields the antenna and the RF generator to prevent RF leakage. Because of the RF energy within the enclosure, ozone has a tendency to form within the enclosure. It has been noted by the present inventor that this ozone can attack the polyamide coating on the antenna at high temperatures causing the polyamide to breakdown thereby exposing areas of the copper antenna to oxidation. Copper oxide is a relatively poor conductor such that large electrical currents through the antenna can cause localized areas of oxidation of the antenna to rapidly heat. As a consequence, the surrounding polyamide coating will be further heated, which can further contribute to the breakdown of the polyamide coating. If the polyamide coating reaches a temperature in excess of 250° C., the coating can begin to burn which can damage the chamber and the antenna itself.

SUMMARY OF THE PREFERRED EMBODIMENTS

It is an object of the present invention to provide an improved RF antenna for semiconductor processing, obviating for practical purposes, the above mentioned limitations, particularly in a relatively uncomplicated electromechanical arrangement.

These and other objects and advantages are achieved in an RF antenna for semiconductor processing in which the antenna is coated with a high temperature oxidation resistant coating. In one embodiment, the antenna which is preferably made of copper, is coated with a thin layer of nickel. As explained in greater detail below, such a nickel coating of the copper antenna has been found to significantly increase the resistance of the antenna to oxidation at high temperatures. It is believed that a nickel coating in accordance with the present invention provides significant protection against oxidation up to 900° C.

Furthermore, the nickel coating is inflammable at these temperatures such than burning of the coating and any resultant damage to the chamber or the antenna are correspondingly reduced or eliminated. Still further, because oxidation of the antenna itself is reduced, the performance of the antenna can be maintained or improved.

DETAILED DESCRIPTION OF PREFERRED EMBODIMENTS

Figure 1:
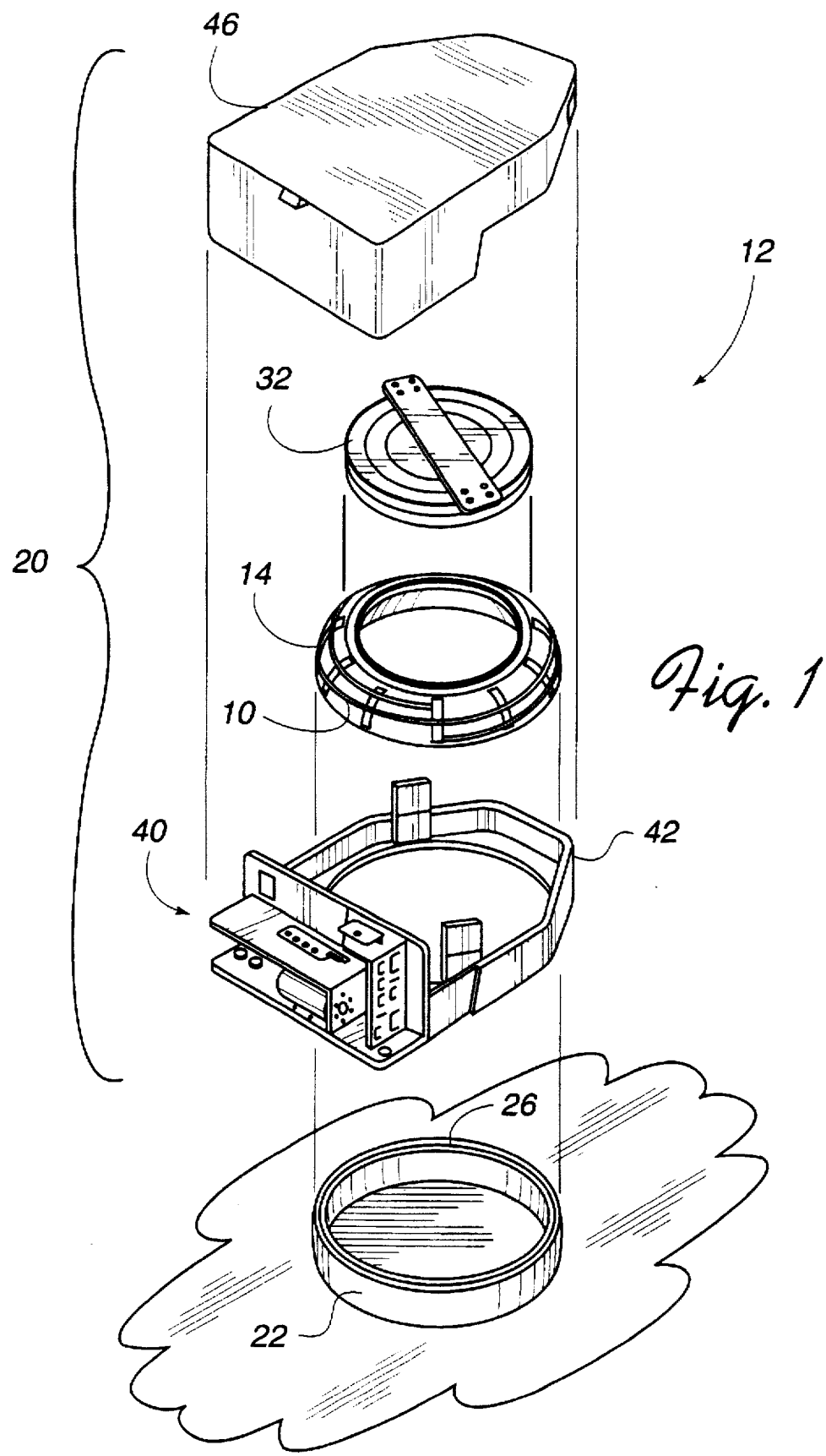
FIG. 1 is an exploded perspective view of a semiconductor processing chamber employing an antenna in accordance with a preferred embodiment of the present invention.

A semiconductor processing chamber employing an RF antenna 10 in accordance with a preferred embodiment of the present invention, is indicated generally at 12 in FIG. 1. As will be explained in greater detail below, the antenna 10 includes a conductive member such as copper wire, and an outer coating or plating which, in the illustrated embodiment, is preferably nickel. It is believed that such a nickel plating of the antenna conductive member significantly increases the resistance of the antenna to oxidation at high temperatures to reduce or eliminate undesirable arcing or burning of the antenna and other parts of the chamber such as a dome of the chamber.

The chamber 12 is used in high density plasma (HDP) deposition processes. However, it is anticipated that an RF antenna in accordance with the present invention may be used in a variety of semiconductor fabrication processes which utilize RF energy including chemical vapor depositions (CVD).

An example of suitable semiconductor processing equipment for carrying out such fabrication processes is the Centura 5200 manufactured by Applied Materials, Inc.

Figure 2:
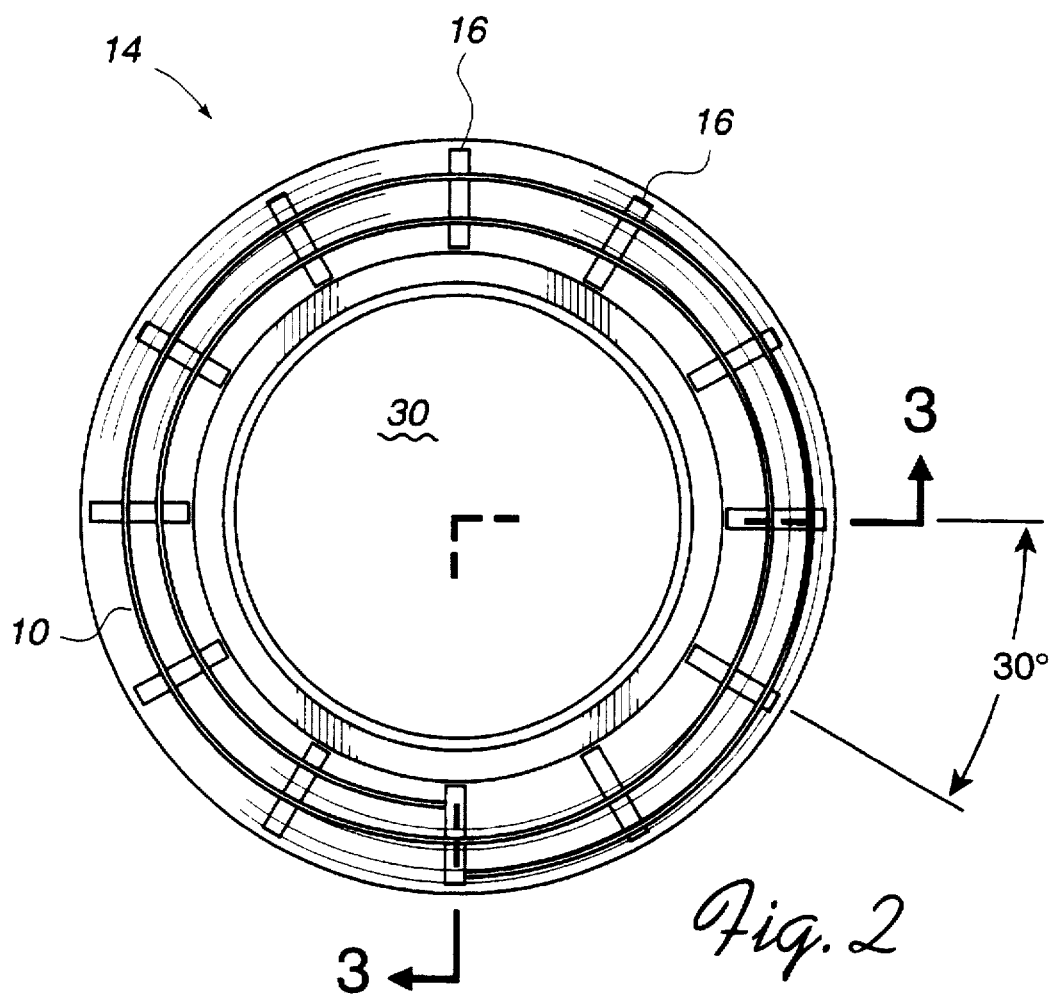
FIG. 2 is a top view of the antenna and dome of the chamber of FIG. 1.
Figure 3:
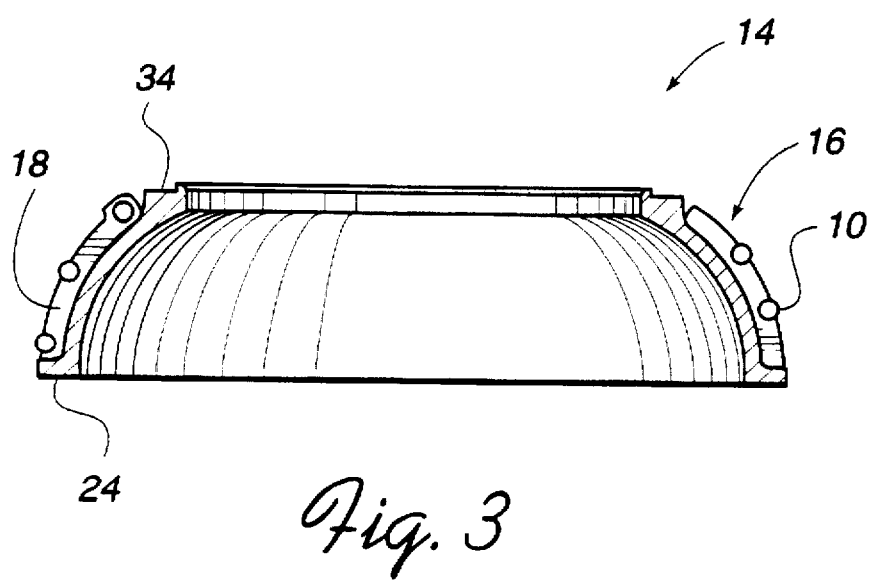
FIG. 3 is a cross-sectional view of the antenna and dome of FIG. 2 as viewed along the line 3—3.

The chamber 12 of the illustrated embodiment includes a quartz dome 14 which, as best seen in FIGS. 2 and 3, is surrounded by the RF antenna 10 which forms spiral-shaped coils on the exterior of the quartz dome 14. The quartz dome 14 has a plurality of comb-like supporting ribs 16 which space the antenna 10 from the surface of the dome 14 as best seen in FIG. 3. In addition, the ribs 16 each have a plurality of teeth members 18 which space the individual coils of the antenna 10 from each other.

The quartz dome 14 is a part of a lid assembly 20 (FIG. 1) which is attached to a chamber body 22 by a hinge (not shown) that allows the lid assembly 20 to be opened for servicing the chamber. The quartz dome 14 has a wide lip 24 (FIG. 3) at the bottom that provides a surface for sealing to the chamber body 22. The top of the chamber body has an O-ring channel that retains a Viton O-ring 26 to seal with the bottom lip 24 of the quartz dome 14.

At the top of the quartz dome 14 is a large opening 30 which is enclosed by a top plate assembly 32 which has a heating coil (not shown) to heat the chamber. An aluminum ring (not shown) carried by the top lip 34 of the dome 14 supports the top plate assembly 32 and provides a stop for compression of two Viton O-rings (not shown) to seal the top plate assembly 32 to the top lip 34 of the quartz dome 14.

An electronics assembly 40 is supported by a shelf 42 coupled to the quartz dome 14. The electronics assembly 40 includes an RF generator and appropriate impedance matching circuits to provide a source of RF energy to the antenna 14. The electronics assembly 40 further includes a resistive controller for the heating coil of the top plate assembly 32. Suitable components for the assembly 40 are well known to those skilled in the art. The electronics assembly 40, quartz dome 14, RF antenna 10 and top plate assembly 32 are all enclosed by an enclosure 46 which shields against RF emissions. The details of the electronics assembly 40 and other elements of the chamber including the dome 14, the top plate assembly 32, the chamber body 22 and the enclosure 46 will depend upon the particular application and are not considered to be relevant to the practice of the present invention.

As previously mentioned, the RF energy emitted by the antenna 10 can cause ozone to form within the enclosure 46 of the chamber lid assembly 20. This ozone can attack any coating which has been applied to the antenna 10 to protect the antenna from oxidation. Prior coatings such as polyamide have shown a tendency to be broken down by the ozone, particularly at high temperatures, exposing portions of the antenna 10 to oxidation. Since copper oxide is a relatively poor conductor, electrical currents through the antenna can cause localized areas of oxidation to rapidly heat. If the heating is sufficient, the polyamide coating can begin to burn, thereby damaging the chamber and the antenna itself.

In accordance with one aspect of the present invention, the RF antenna 10 is a copper wire or tube plated with a nickel coating. It has been found that such a nickel coating is able to resist oxidation, even at temperatures in excess of 250° C. at which a polyamide coating would begin to burn. By comparison, it is believed that the nickel coating can withstand temperatures up to 900° to 1000° C. without undergoing combustion.

Under typical operating conditions, it is anticipated that the nickel coating will undergo some oxidation. However, it has been found that any such outer layer of nickel oxide is relatively stable and strong and therefore still protects the underlying copper of the antenna from substantial deleterious oxidation. Thus, the copper is protected by both the nickel coating in its unaltered form as well as by nickel oxide that may form on the nickel coating.

In a preferred embodiment, the nickel coating is applied to the copper wire of the antenna using a standard electroless deposition of low phosphorus nickel.

For example, the plating may be performed by chemical deposition of an amorphous, high nickel, low phosphorus metallic compound on a catalytic or catalyzed surface from an aqueous bath containing nickel and hypophosphite ions. The bath may include a soluble compound to inhibit decomposition of the bath. It is preferred that the chemical bath have a phosphorus content of less than 8% so that the resultant nickel coating likewise have a phosphorus content of less than 8%. The nickel is preferably plated on the copper wire to a thickness of 0.0001 to 0.001 inches. After plating, the antenna should be rinsed and dried and then heat treated, preferably in a circulating air furnace at approximately 190° C. for not less than 3 hours. By having a low phosphorus content, the nickel plating will permit the antenna wire to be flexed and formed into the desired antenna shape as the antenna is attached to the chamber without excessive cracking, flaking or blistering of the nickel coating.

The antenna 10 is illustrated schematically as being bent into a coil having a plurality of turns surrounding the dome 14 of the chamber. It has been found that the low phosphorus nickel coating described herein is capable of being flexed and bent in a number of such turns without suffering substantial cracking or other damage to the protective coating. The optimal number of turns of the coil will depend upon the particular application and is not considered to be relevant to the practice of the present invention.

It is recognized that the protective coating may be applied to the copper antenna using a variety of other methods. For example, the nickel may be applied to the copper using a chemical vapor deposition (CVD) process. It is preferred, however, that the resultant nickel coating have a relatively high nickel content (preferably in excess of 92%) and that the nickel have a strong adherence to the underlying copper material. Of course, layers of other types of materials may be interposed between the nickel coating and the underlying copper material as well as coated on the exterior of the nickel coating.

The best mode presently known to the present inventor for protecting the invention is to coat copper wire with a coating of at least 92% nickel. However, in an alternative embodiment, other types of high temperature, oxidation resistant materials may be substituted for nickel. For example, rhodium, platinum, palladium and chromium may be plated on the copper antenna, using conventional deposition techniques, to provide an oxidation resistant coating on the antenna. Other materials for forming a high temperature, oxidation resistant coating on the antenna include ceramic materials. The ceramic coating may be formed by applying a slurry to the antenna and firing the slurry in accordance with conventional techniques for forming ceramics.

With respect to the conductive member of the antenna 10, other highly conductive materials besides copper may be used such as silver. In addition, the antenna conductive member may be formed from plates and tubing as well as wires and may be formed into a variety of other shapes including planar coils and plates and cylindrical coils and plates.

While the present invention has been described with reference to specific preferred embodiments thereof, it will be understood by those skilled in this art that various changes may be made without departing from the true spirit and scope of the invention. In addition, many modifications may be made to adapt the invention to a given situation without departing from its essential teachings.

What is claimed is:

1. A semiconductor processing device, comprising:
    a chamber;
    a source of RF energy; and
    an antenna coupled to the RF energy source and positioned to couple RF energy into the chamber, wherein the antenna comprises a conductive member and a coating layer carried by the conductive member, said coating layer comprising Ni.

2. The semiconductor device of claim 1 wherein the antenna conductive member comprises copper.

3. The semiconductor device of claim 2 wherein the antenna conductive member comprises a copper coil.

4. The semiconductor device of claim 3 wherein the coil surrounds at least a portion of the chamber.

5. The semiconductor device of claim 3 wherein the chamber comprises a dome and the coil surrounds the dome.

6. The semiconductor device of claim 1 wherein the coating layer is at least 92% nickel.

7. The semiconductor device of claim 1 wherein the coating layer is 0.0001 to 0.001 inches thick.

8. The semiconductor device of claim 1 wherein the coating layer comprises less than 8% phosphorus.

9. A semiconductor processing device for use with a source of RF energy, comprising:

a chamber; and an antenna adapted to be coupled to the RF energy source and positioned to couple RF energy into the chamber, wherein the antenna comprises a conductive member and a coating layer carried by the conductive member, said coating layer comprising a material selected from the group of nickel, rhodium, platinum, palladium and chromium.

10. A semiconductor processing device for use with a source of RF energy, comprising:

a chamber; and an antenna adapted to be coupled to the RF energy source and positioned to couple RF energy into the chamber, wherein the antenna comprises a conductive member and metallic coating means for protecting the conductive member against oxidation to a temperature in excess of 250° C.

11. A process for manufacturing a semiconductor device, comprising:

coupling RF energy into a chamber from a nickel-coated antenna; and depositing energized material onto a semiconductor device.

12. A process for manufacturing a semiconductor device, comprising:

coupling RF energy into a chamber from an antenna coated with a material selected from the group of nickel, rhodium, palladium, platinum and chromium; and depositing material onto a semiconductor device.

13. A process for manufacturing an RF antenna for a semiconductor processing chamber, comprising:

coating a conductive member with a material selected from the group of nickel, rhodium, palladium, platinum and chromium; and bending the coated conductive member to form at least a portion of an RF antenna.

14. A semiconductor processing device, comprising:

a chamber including a body, and a quartz dome having a plurality of ribs; and a nickel-coated spiral-shaped copper antenna supported by said plurality of ribs for coupling RF energy through said dome into said chamber.

15. A semiconductor processing device, comprising:

a chamber including a dome;

a source of RF energy; and an antenna surrounding said dome and coupled to said source of RF energy to couple RF energy into said chamber, wherein said antenna comprises a conductive member and a coating layer carried by the conductive member, said coating layer comprising at least 92% Ni.

16. A semiconductor processing device, comprising:

a chamber including a dome;

a source of RF energy; and an antenna surrounding said dome and coupled to said source of RF energy to couple RF energy into said chamber, wherein said antenna comprises a conductive member and a coating layer carried by the conductive member, said coating layer comprising a material selected from the group of nickel, rhodium, platinum, palladium and chromium.

17. A process for manufacturing an RF antenna for a semiconductor processing chamber, comprising:

bending a conductive member to form at least a portion of an RF antenna; and coating said conductive member with a material selected from the group of nickel, rhodium, palladium, platinum and chromium.

* * * * *